(12) United States Patent
Batra et al.

(10) Patent No.: US 10,879,034 B2
(45) Date of Patent: Dec. 29, 2020

(54) MEMBRANELESS PLATFORM FOR CORRELATED ANALYSIS OF NANOMATERIALS

(71) Applicant: KING ABDULLAH UNIVERSITY OF SCIENCE AND TECHNOLOGY, Thuwal (SA)

(72) Inventors: Nitin M. Batra, Thuwal (SA); Pedro Miguel Costa, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 0 days.

(21) Appl. No.: 16/611,281

(22) PCT Filed: Jun. 12, 2018

(86) PCT No.: PCT/IB2018/054264
§ 371 (c)(1),
(2) Date: Nov. 6, 2019

(87) PCT Pub. No.: WO2018/234930
PCT Pub. Date: Dec. 27, 2018

(65) Prior Publication Data
US 2020/0168432 A1 May 28, 2020

Related U.S. Application Data

(60) Provisional application No. 62/677,333, filed on May 29, 2018, provisional application No. 62/522,913, filed on Jun. 21, 2017.

(51) Int. Cl.
*H01J 37/20* (2006.01)
*B82Y 35/00* (2011.01)

(52) U.S. Cl.
CPC ............. *H01J 37/20* (2013.01); *B82Y 35/00* (2013.01); *H01J 2237/2802* (2013.01)

(58) Field of Classification Search
CPC .... H01J 37/20; H01J 2237/2802; B82Y 35/00
See application file for complete search history.

(56) References Cited

U.S. PATENT DOCUMENTS 7,482,587 B1  1/2009 Finch
8,872,129 B2  10/2014 Damiano et al.
(Continued)

FOREIGN PATENT DOCUMENTS

CN  206163454 U  5/2017
EP  2942801 A1  11/2015
EP  3062082 A1  8/2016

OTHER PUBLICATIONS

Costa, P.M.F.J. et al., "Direct Imaging of Joule Heating Dynamics and Temperature Profiling Inside a Carbon Nanotube Interconnect," Nature Communications, Aug. 9, 2011, pp. 1-6.
(Continued)

*Primary Examiner* — Nicole M Ippolito
*Assistant Examiner* — Hanway Chang
(74) *Attorney, Agent, or Firm* — Patent Portfolio Builders PLLC

(57) ABSTRACT

A multipurpose membraneless sample platform for supporting a target material, includes a substrate; a dielectric layer formed over a side of the substrate; first and second electrodes formed over the dielectric layer; and a window formed through the substrate and the dielectric layer. There is no material covering the window.

20 Claims, 15 Drawing Sheets

(56) References Cited

U.S. PATENT DOCUMENTS

| | | |
|---|---|---|
| 9,040,939 B2 | 5/2015 | Damiano et al. |
| 2008/0280099 A1 | 11/2008 | Hutchison et al. |
| 2017/0062177 A1 | 3/2017 | Walden, II et al. |

OTHER PUBLICATIONS

Erts, D. et al., "Instrumentation of STM and AFM Combined with Transmission Electron Microscope," Applied Physics A, Materials Science & Processing, Mar. 27, 2001, vol. 72, Supplement 1, pp. S71-S74.

Grant, A.W. et al., "Transmission Electron Microscopy 'Windows' for Nanofabricated Structures," Institute of Physics Publishing, Nanotechnology, Jul. 16, 2004, vol. 15, pp. 1175-1181.

Grogan, J.M. et al., "The Nanoaquarium: A Platform for In Situ Transmission Electron Microscopy in Liquid Media," Journal of Microelectromechanical Systems, Aug. 2010, vol. 19, No. 4, pp. 885-894.

International Search Report in corresponding/related International Application No. PCT/IB2018/054264, dated Oct. 1, 2018.

Kearns, G.J. et al., "Substrates for Direct Imaging of Chemically Functionalized SiO2 Surfaces by Transmission Electron Microscopy," Analytical Chemistry, Jan. 1, 2006, vol. 78, No. 1, pp. 298-303.

Komatsu, M. et al., "A New Type of Very-High Temperature Heating Stage and In Situ Experiments on α-Al2O3 Crystals," Japanese Journal of Applied Physics, Aug. 1982, vol. 21, No. 8, pp. 1233-1237.

Mele, L. et al., "A MEMS-Based Heating Holder for the Direct Imaging of Simultaneous In0Situ Heating and Biasing Experiments in Scanning/Transmission Electron Microscopes," Microscopy Research and Technique, Jan. 28, 2016, pp. 239-250.

Verheijen, M.A. et al., "Transmission Electron Microscopy Specimen Holder for Simultaneous In Situ Heating and Electrical Resistance Measurements," Review of Scientific Instruments, Feb. 2004, vol. 75, No. 2, pp. 426-429.

Wang, Z.L. et al., "Measuring Physical and Mechanical Properties of Individual Carbon Nanotubes by In Situ TEM," Journal of Physics and Chemistry of Solids, Jul. 2000, vol. 61, pp. 1025-1030.

Written Opinion of the International Searching Authority in corresponding/related International Application No. PCTIB2018/054264, dated Oct. 1, 2018.

Yuzvinsky, T.D. et al., "Imaging the Life Story of Nanotube Devices," Applied Physics Letters, Aug. 15, 2005, vol. 87, 083103-1-083103-3.

Zhang, M. et al., "In Situ Transmission Electron Microscopy Studies Enabled by Microelectromechanical System Technology," Journal of Materials Research, Jul. 1, 2005, vol. 20, No. 7, pp. 1802-1807.

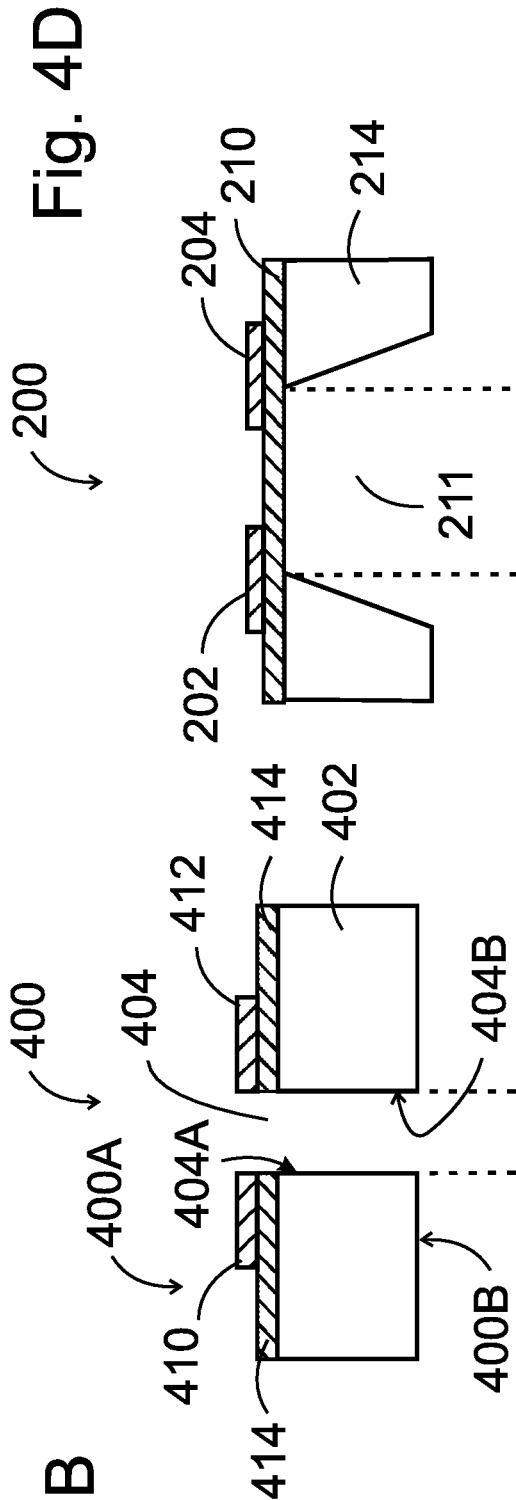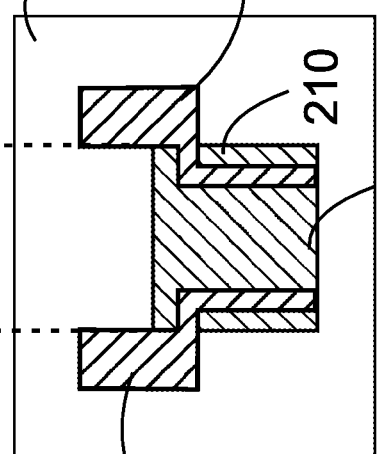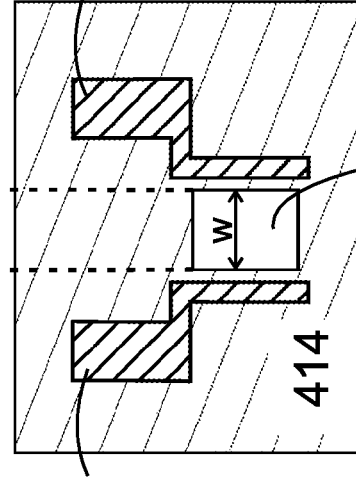

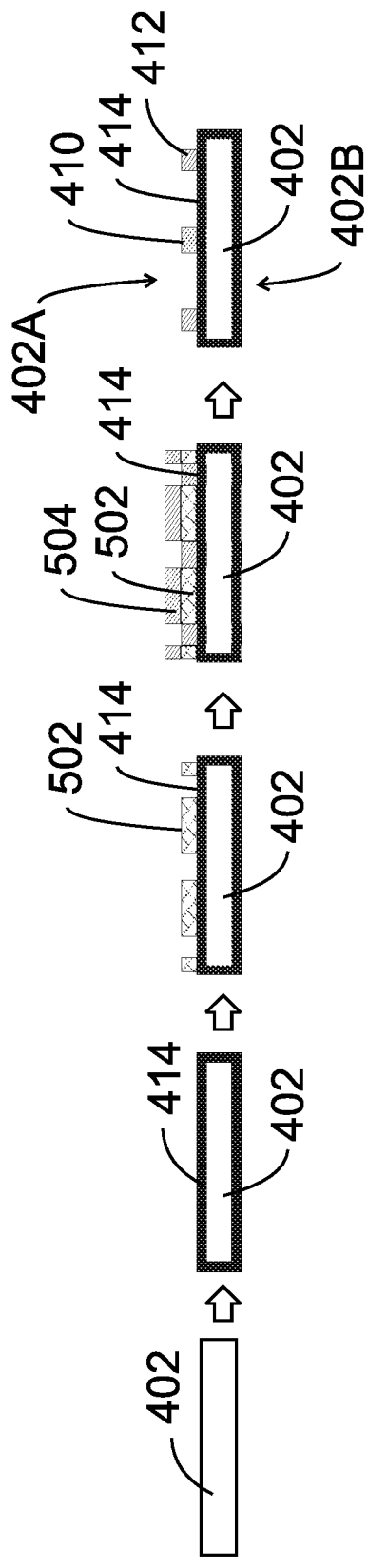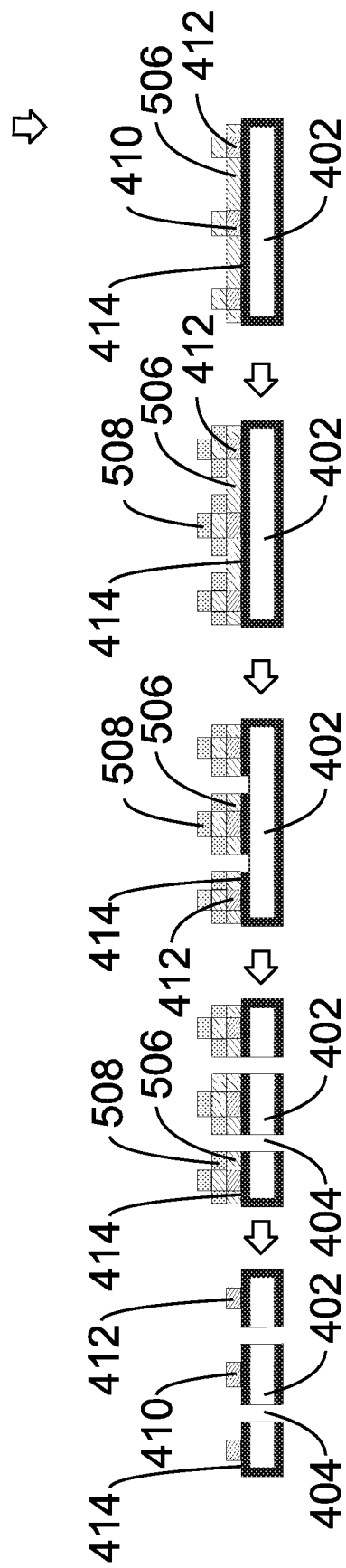

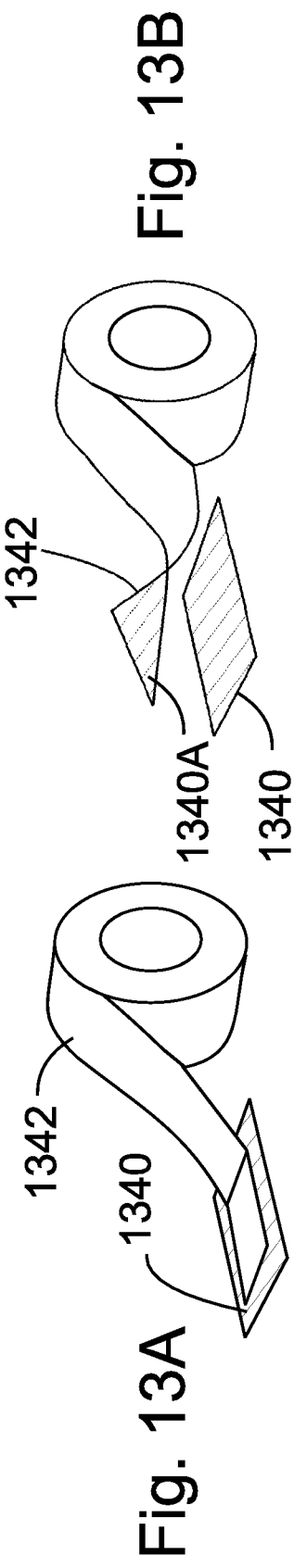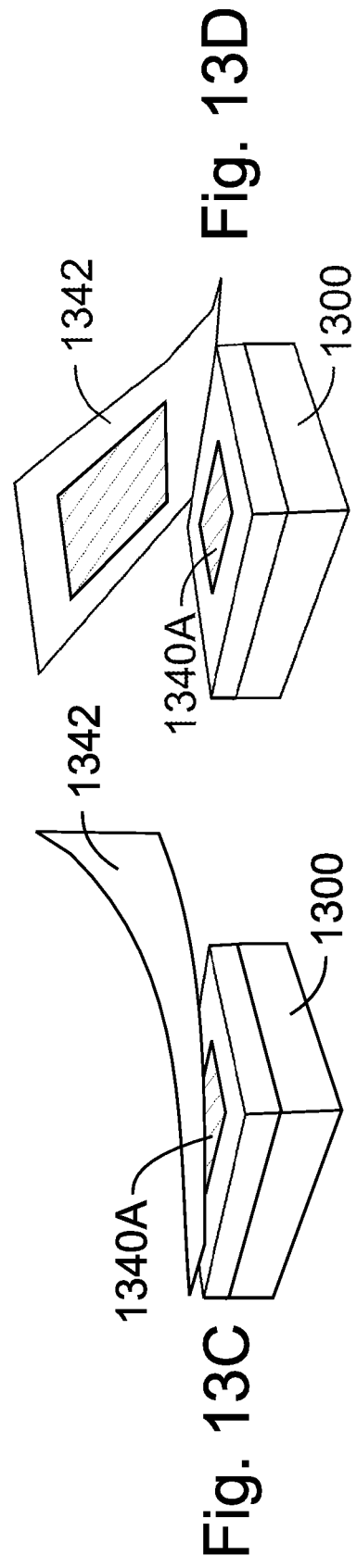

| | | Membrane Chips (commercially available) | Membraneless Chips (KAUST) |
|---|---|---|---|
| Correlated in-situ/ex-situ single particle analysis | | Limited | Available (TEM/SEM/Raman/AFM/Chemical) |
| Ex-situ processing (chemical stability) | | Good | Good |
| Mechanical stability | | Membrane rupture | Excellent |
| Reusability | | No | Yes (samples can be washed away and chip re-used) |
| Electrical interferences | | Yes | No |
| Electron beam induced charging | | Yes | No |
| Device degradation | | Yes (membrane) | No |
| Image drift | | Yes (membrane expansion/contraction) | No |
| Image contrast | | Limited to holes in membrane | Excellent |
| Electrode spacing | | >5 μm | >1 μm |
| Sample transfer methods | Drop casting | Yes | Yes |
| | Wet transfer | Yes | Yes |
| | FIB lamella | Yes | Yes |
| | Spin coating | No | Yes |
| | Mechanical exfoliation | No | Yes |
| Cleaning method | Ultrasonication | No | Yes |
| | Rinse in solvent or acid or base | Yes | Yes |
| | Nitrogen blow drying | No | Yes |

Fig. 15

MEMBRANELESS PLATFORM FOR CORRELATED ANALYSIS OF NANOMATERIALS

CROSS-REFERENCE TO RELATED APPLICATIONS

This application is a U.S. National Stage of International Application No. PCT/IB2018/054264, filed on Jun. 12, 2018, which claims priority to U.S. Provisional Patent Application No. 62/522,913, filed on Jun. 21, 2017, entitled "Membraneless Support Platforms for Correlated Materials Characterization," and to U.S. Provisional Patent Application No. 62/677,333, filed on May 29, 2018, entitled "Membraneless Platform for Correlated Analysis of Nanomaterials," the disclosures of which are incorporated here by reference in their entirety.

BACKGROUND

Technical Field

Embodiments of the subject matter disclosed herein generally relate to a sample platform that fits into a materials characterization tool, and more specifically, to a perforated membraneless sample platform that can be used to support samples of nanomaterials and be either integrated in a sample holder or placed on its own in the investigating tool.

Discussion of the Background

For decades, as the fields of nanoscience and nanotechnology matured, materials synthesis and device fabrication processes evolved. Alongside, characterization tools such as transmission electron microscopes (TEM) made large strides in assisting the study of particles that are just a few billionth parts of a meter in size.

While a large number of nanomaterials have been reported, their technological integration is dependent on knowing the structure-property relation as these are not necessarily straightforward at the nanoscale. Various investigating tools (transmission electron microscope, light microscope, Raman microscope and atomic force microscope, etc.) are currently used to characterize samples of nanomaterials (quantum dots, nanowires, nanotube, nanosheets, etc.). These tools provide complementary information on the objects of study and are commonly used in a separate and sequential way. Rarely does one have the possibility to undertake these studies in a correlated way or as a fully integrated assessment flow, particularly in respect to the analysis of a single component nanoparticle. The lack of integration between the many investigating tools available derives, in great part, from the fact that there is no common standard. Each investigating tool requires different ways to prepare the object of study for examination or has different types of sample holders. An example is the transmission electron microscope (TEM). Its sample holders cannot be used for any other purpose or in any other investigating tool. While the sample may be mounted in support grids (which are then mounted in the sample holder), the grids are generally made from thin metal foils meaning these can hardly be used to sustain chemical processing on the sample or allow electrical probing of a discrete nanoparticle.

The electrical properties of materials have been studied for many years using contacts fabricated by wire bonding, lithography or the so-called direct deposition techniques that include electron or ion beam induced deposition. Classically, the measurements were performed with tools such as scanning tunneling microscopes (STM) or manual probe stations. While very detailed studies on transport properties could be carried out, it was seldom the case where complementary information concerning crystal structure or chemical composition of the material was collected from the area probed electrically. By contrast, the study of electrical responses inside a TEM is a unique way to explore and understand the relationship between properties, structure and chemical composition of materials.

In the following, the design of a traditional sample platform is discussed. The sample platform can be designed to be mounted in the sample holder of a TEM, an investigating tool that enables the study at, or near, atomic resolution of materials with dimensions ranging from a few micrometers down to some nanometers.

The TEM is composed of several sections amongst which is the column where the electromagnetic lenses—that guide and focus the imaging electrons—are located. Its sample holder 100 is shown in FIG. 1, which is a seamless assembly of several machined parts. The sample holder 100 is placed in position for analysis through a hole transversal to the main axis of the column. One of the parts of the sample holder 100 is a long rod-shaped section 102 that terminates in a thinner flat section 104 where the sample or sample support is placed.

There are some types of materials such as metal alloys that can be thinned down and cut into shape to be directly loaded to the flat section 104. However, for nanomaterials, a sample platform is required. This sample platform can be a metal grid, as mentioned before, or a diced sample platform 200 as shown in FIG. 2. The latter is a fairly recent type of sample platform and it can be designed in many different ways to fit into the flat section 104 of the sample holder 100. Both TEM sample holder and sample platform are fabricated from non-magnetic materials to avoid any interference with electron beam and microscope lens.

Over the past decade, a common design has dominated the fabrication of the sample platform 200. In essence, and while they may serve different purposes (e.g., heating, electrical probing, etc.), they all rely on an electron-transparent membrane 202 to sustain the nanomaterials to be studied. This membrane is made of a thin layer of silicon nitride or silicon dioxide, its thickness ranging from some nanometres to a few micrometres. Generally, the sample platforms are consumable parts with an overall size of 15 to 80 mm$^2$ and sample loading areas of 400 to 2500 µm$^2$. Their fabrication results from a complex combination of clean room techniques which includes lithography, wet etching and metal deposition processes, as described, for example, in U.S. Patent Application Publication 2008/0280099/A1 and U.S. Pat. Nos. 7,482,587/B1, 8,872,129/B2, and 9,040,939/B2.

In various implementations of the sample platform 200, the platforms are designed and fabricated with the intent of probing the electrical response of nanomaterials. In these cases, the aforementioned membrane 202 not only support the sample, but can also serve to sustain and stabilize the electrodes to which the component particles of the sample will be contacted to. The electrodes 300 are thin lines of deposited metal that terminate in pads 302, as shown in FIG. 3. Metal wires, running through the inside of the rod-shaped section 102, are arranged in such a way that they selectively connect to each one of the pads 302. The number of the electrodes 300 can differ from two to six or more and have different shapes and/or lengths (see, for example, U.S. Pat. No. 8,872,129/B2).

Besides the role of support, the membrane 202 needs to be transparent to the electron beam (for imaging purposes) and electrically insulating (for functional purposes, e.g. localized heating, flow of current, etc.).

Given that the membrane 202 is very thin and made of brittle materials, a common problem is that, if the membrane 202 breaks, then the entire sample platform 200 becomes unusable. Further, even if the membrane 202 does not break, the sample platforms 200 are non-reusable, which is an increased cost factor for users.

Given that the membrane 202 is made of silicon nitride or silicon oxide, and these materials are dielectric materials, the electrical probing experiments performed inside a TEM may be influenced by charging. The imaging beam of the TEM is composed of charged particles (electrons) that, upon interaction with the dielectric membrane 202, may originate relatively strong electrostatic fields around the sample.

Other known limitations derived from the presence of a membrane are: reduction of image contrast, fatigue upon experimental cycling and image drift due to thermally induced expansion/buckling of the membrane 202.

Thus, there is a need to design a new type of sample platform that holds a target material without being affected by the above discussed shortcomings.

SUMMARY

According to an embodiment, there is a multipurpose membraneless sample platform for supporting a target material. The platform includes a substrate, a dielectric layer formed over a side of the substrate, first and second electrodes formed over the dielectric layer, and a window formed through the substrate and the dielectric layer. There is no material covering the window.

According to another embodiment, there is an imaging device for analyzing a target material. The imaging device includes a source of a beam of electromagnetic radiation; a membraneless sample platform that supports the target material, and a screen on which an image of the target material is displayed. The membraneless sample platform includes a substrate, a dielectric layer formed over a side of the substrate, first and second electrodes formed over the dielectric layer, and a window formed through the substrate and the dielectric layer. The beam passes through the window without interacting with any material.

According to still another embodiment, there is a method for manufacturing a membraneless sample platform that includes a step of providing a substrate, a step of depositing a dielectric layer over the substrate, a step of depositing first and second electrodes over the dielectric layer, and a step of etching a window through the substrate and the dielectric layer. There is no material covering the window.

BRIEF DESCRIPTION OF THE DRAWINGS

The accompanying drawings, which are incorporated in and constitute a part of the specification, illustrate one or more embodiments and, together with the description, explain these embodiments. In the drawings:

FIGS. 4A and 4B show a membraneless sample platform and FIGS. 4C and 4D show the membrane-based sample platform;

FIGS. 5A to 5J illustrate the various stages of forming a membraneless sample platform;

FIGS. 13A to 13D illustrate an exfoliation method for attaching a target material to a membraneless sample platform;

FIG. 15 illustrates various advantages of the membraneless sample platform relative to a traditional membrane-based sample platform.

DETAILED DESCRIPTION

Figure 1:
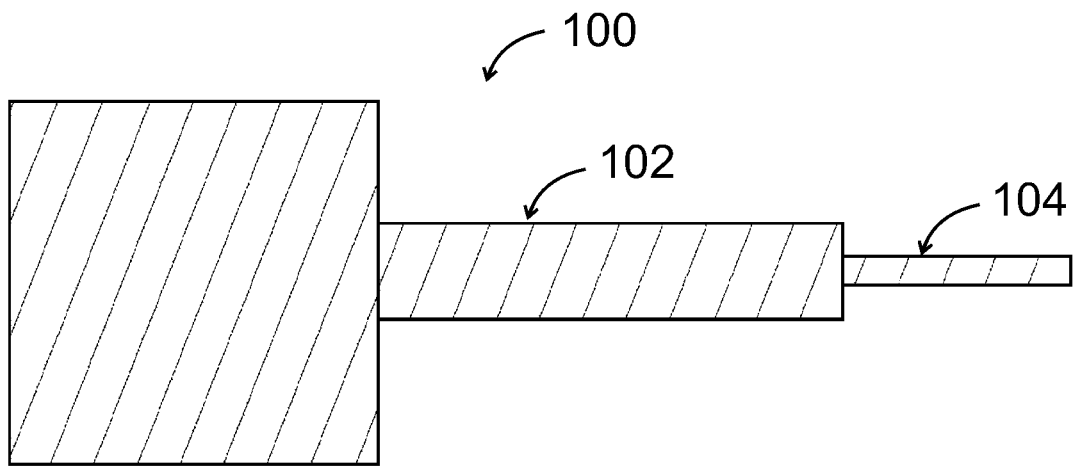
FIG. 1 illustrates a traditional sample holder for a TEM microscope.
Figure 2:
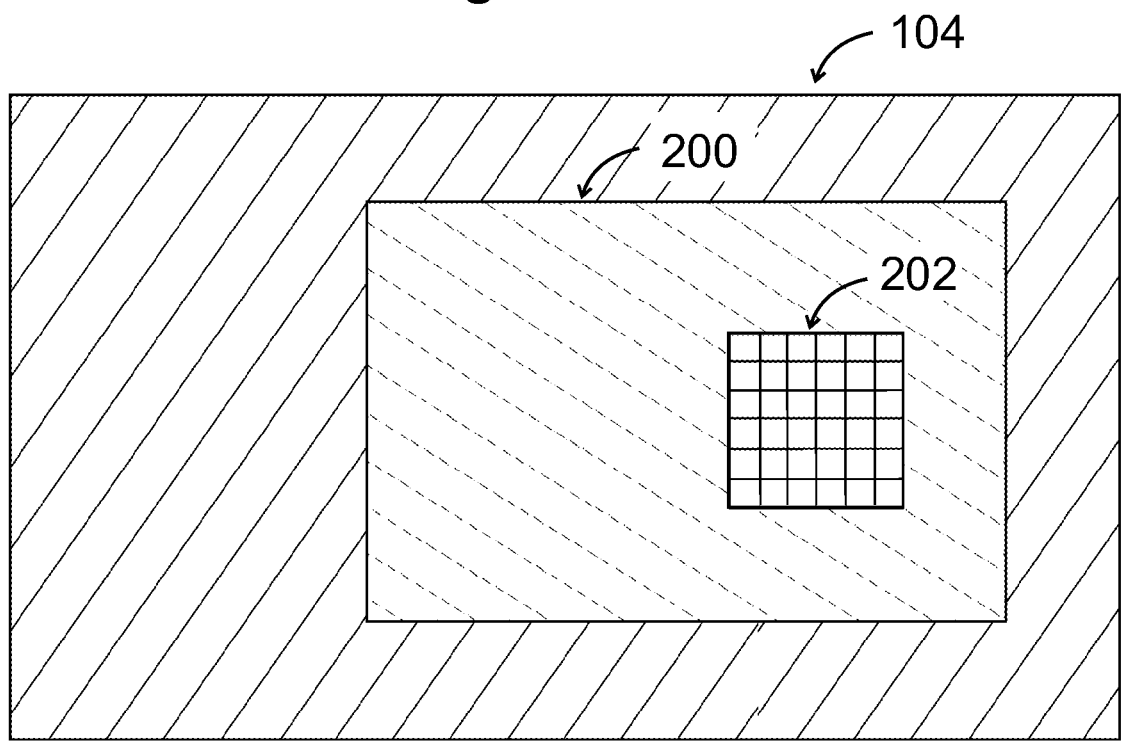
FIG. 2 illustrates a flat section of a TEM sample holder, including a sample platform and a membrane.
Figure 3:
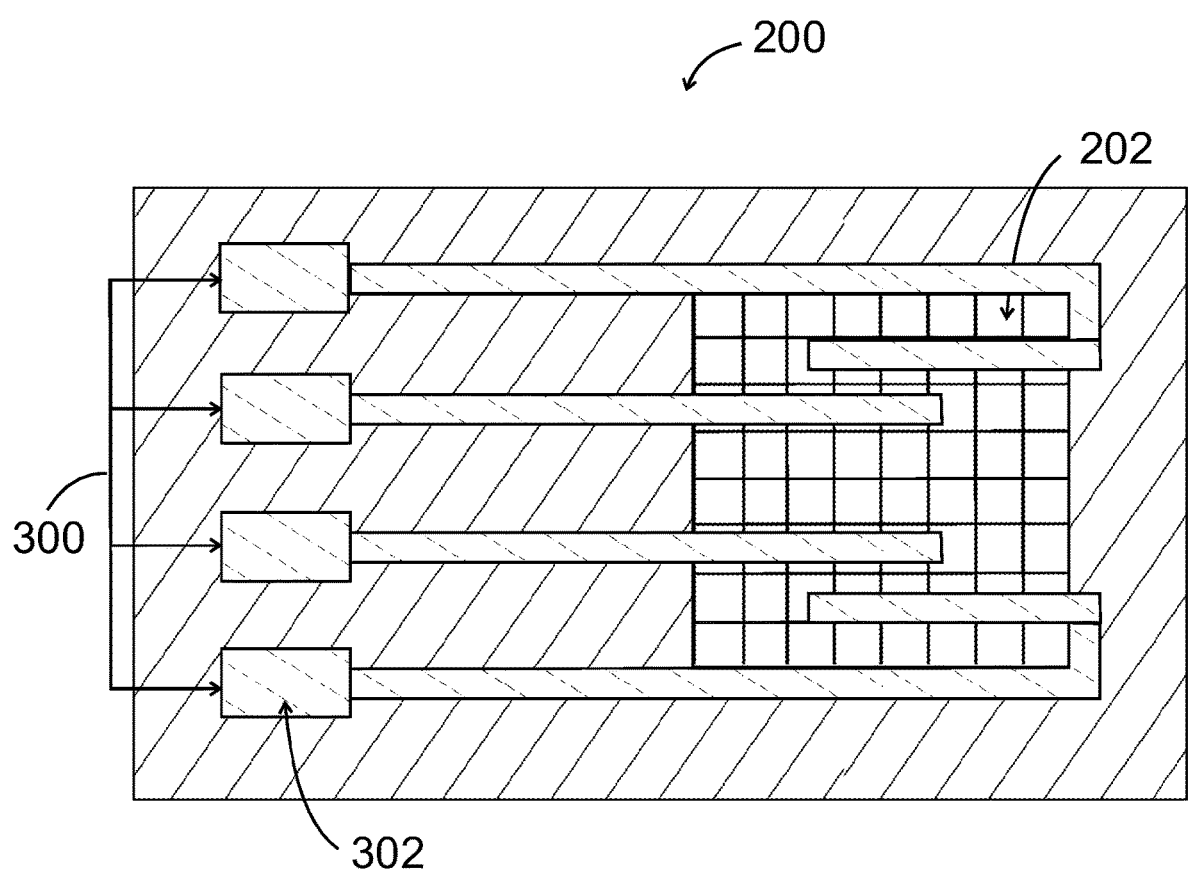
FIG. 3 schematically illustrates a membrane-based sample platform designed for electrical probing of nanomaterials and having four independent electrodes.

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a membraneless sample platform that holds a target material for analysis in a TEM. However, the embodiments discussed herein are not limited to TEM systems, but may be applied to any investigating tool that uses a sample platform for holding a target material.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, a sample platform (also called in the following a membraneless platform or simply, platform) is designed and manufactured to not include a membrane. This means, that one or more openings (windows) formed in the platform are not covered by a membrane, as is the case in the traditional membrane-based sample platforms. The lack of a membrane allows for higher frame production yields, makes the platform re-usable thereby reducing consumable costs over the term of a research project, provides improved mechanical stability to the platform and avoids measurements issues such as charging and drift.

Further to the above, the absence of a membrane offers the unique capability of performing correlated ex-situ processing and characterization of the exact same nanoparticle. With the traditional membrane-base sample platforms, sample processing such as exposure to a reactive liquid or gas is extremely challenging. More so, if the reactive medium is heated. In the absence of a membrane, the platforms can withstand strong acid baths just as well as high-temperature air flows in a tubular furnace. Provided the nanoparticle is well-fixed, this allows following its life-cycle after exposure to reactive medium. Also, considering the platform can be moved into an Raman spectrometer, an AFM stand, a probe station, etc., the characterization is truly correlated to that one nanoparticle.

A membraneless sample platform 400 is shown in FIGS. 4A and 4B and this contrasts with a traditional membrane-based sample platform 200. FIG. 4A shows the membraneless sample platform 400 including a substrate 402 having a window 404. On two opposite sides 404A and 404B of the window 404 are formed two electrodes 410 and 412. Note that the electrodes may have any shape. The electrodes 410 and 412 may be deposited on top of a dielectric layer 414. The dielectric layer 414 can be made of silicon oxide or silicon nitride. The substrate 402 may be made as a silicon wafer and the electrodes 410 and 412 may include gold and/or platinum. Those skilled in the art would understand that other materials with similar properties may be used.

FIGS. 4A and 4B show that there is no layer or member or any other element formed to cover the window 404, i.e., there is a free passage from one side 400A of the frame 400 to the opposite side 400B. This is not the case in the sample platform 200. In FIGS. 4C and 4D, whose window 211 is blocked at least by the membrane 210. Thus, the membraneless sample platform 400 shown in FIGS. 4A and 4B achieves one or more of the advantages discussed above over the traditional membrane-based platform 200.

Figure 6:
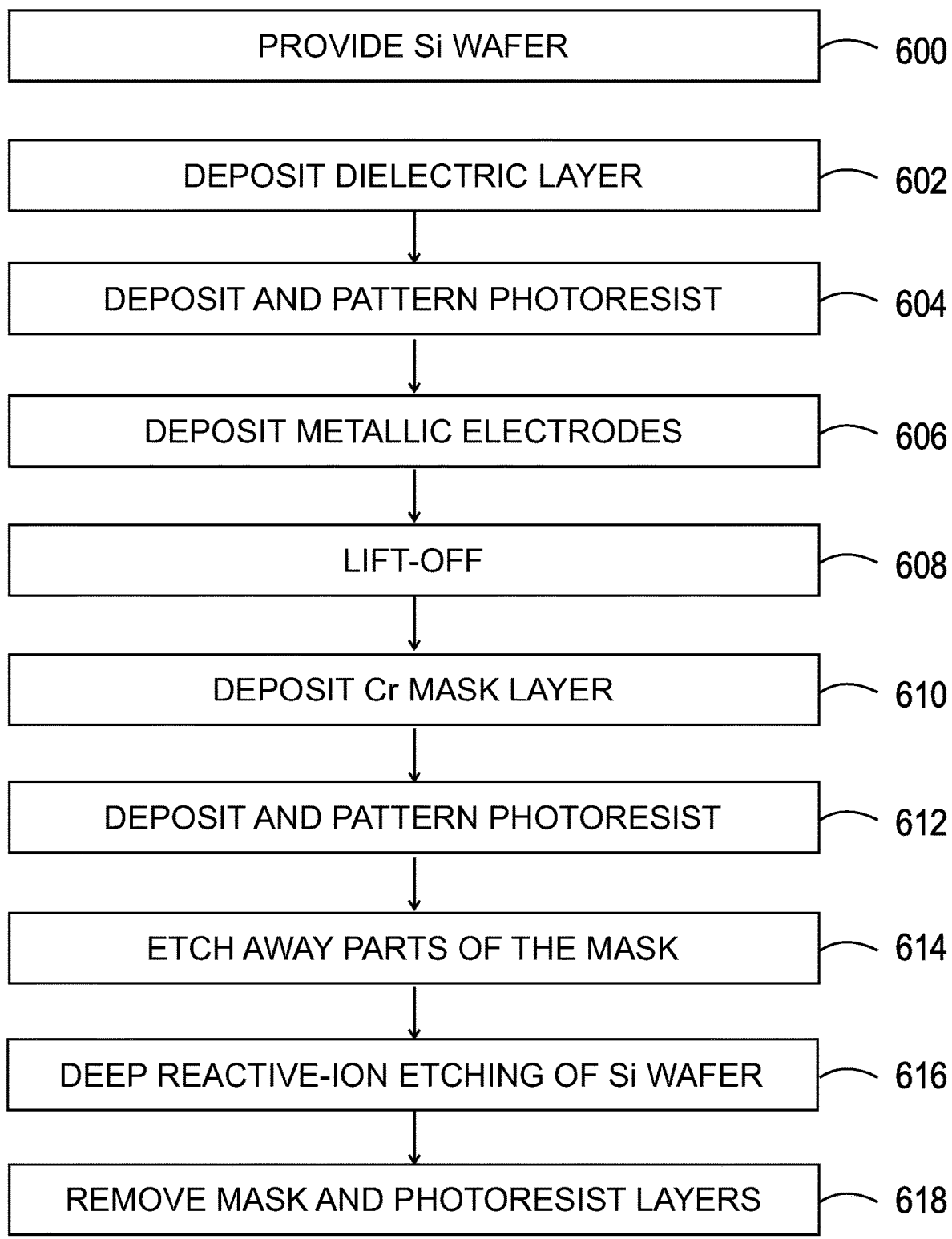
FIG. 6 is a flowchart of a method for forming a membraneless sample platform.

The steps for forming the membraneless platform 400 is now discussed with regard to the scheme in FIG. 6. This discussion relates to one particular design to obtain the window 404 shown. Other designs followed an adapted approach from the one discussed. While specific materials are mentioned in FIG. 6, to illustrate the method of making the membraneless platform, one skilled in the art would understand that other materials and/or processes may be used to achieve the same product. In step 600, a silicon (Si herein) wafer is provided as illustrated in FIG. 5A. The Si wafer may have a diameter of 100 mm. Larger or smaller sizes may be used. Next, in step 602, a dielectric layer is deposited on the entire Si wafer 402, as shown in FIG. 5B. The dielectric layer 414 can be formed by silicon oxide or silicon nitride deposition. In the following step 604, a photoresist 502 is deposited on top of the dielectric layer 414 and then the photoresist is patterned to define the electrodes' positions (see FIG. 5C). The patterns can be drawn to result in electrodes with diverse shapes and sizes. In step 606, a metallic layer 504 of gold and/or platinum is deposited by evaporation or sputtering (see FIG. 5D). Someone skilled in the art will recognize that other metals may be deposited using these or other methods. In step 608, the photoresist 502 and the metallic layer 504 portions, which were formed on top the photoresist, are removed by a lift-off process (see FIG. 5E). Thus, in this step, only the electrodes 410 and 412 and the dielectric layer 414 are left on the top side 402A of the Si wafer 402. Note that the number of electrodes may vary. Also note that the silicon oxide layer 414 is still covering the top side 402A and the bottom side 402B of the initial Si wafer.

In step 610, a mask 506 (e.g., chromium) is deposited over the dielectric layer 414 and the electrodes 410 and 412, on the top side of the Si wafer 402, as shown in FIG. 5F. Chromium is used as a hard mask for deep reactive-ion etching (DRIE) etching. In step 612, a layer of photoresist 508 is deposited over the mask 506 and the photoresist is then patterned. The places where the photoresist was removed correspond to the future windows to be formed in the Si wafer, as shown in FIG. 5G. In step 614, etching is applied to remove the mask 506 and the dielectric layer 414 to expose the Si wafer at desired locations where the windows are to be formed, as illustrated in FIG. 5H. In step 616, DRIE is used to etch the substrate 402 from the front so that one or more windows 404 are excavated into the Si wafer 402, as shown in FIG. 5I. A width w of the window 404 may be between 1 and 100 microns, with a preferred range of 2 to 20 microns. Note that the narrow width of the window 414 can be achieved because of the DRIE process. While FIG. 5I shows two windows formed in the Si wafer 402, those skilled in the art would understand that any number of windows may be formed.

Finally, in step 618, the mask layer 506 and the remaining of photoresist 508 are removed, as shown in FIG. 5J. The structure obtained in FIG. 5J has no membrane covering the window 404 and has the electrodes 410 and 412 formed over the dielectric layer 414. In one application, the dielectric layer 414 is formed directly on top of the Si wafer 402 and the electrodes 410 and 412 are formed directly on top of the dielectric layer 414.

Figure 7B:
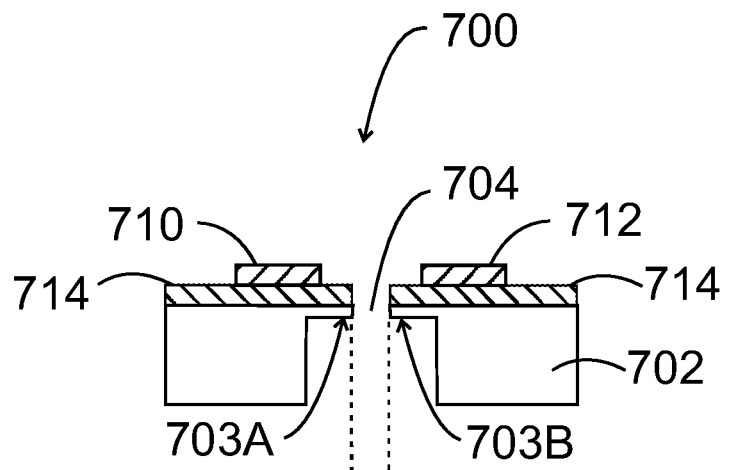
FIGS. 7A and 7B illustrate a membraneless sample platform having thinned down portions that define a rectangular window.
Figure 7A:
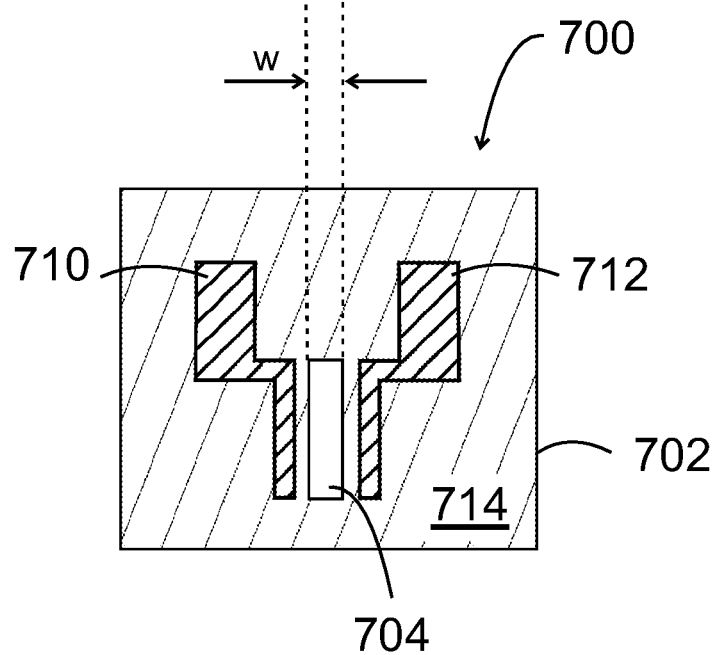

While FIGS. 4A and 4B show a membraneless sample platform having a single rectangular window 414, it is possible to shape the window(s) differently. For example, FIGS. 7A to 10B shows some variations of the membraneless sample platform. FIGS. 7A and 7B show a membraneless sample platform 700 having a very narrow window 704. In one embodiment, the width w of the window 704 is equal to or less than 10 microns. Different from the membraneless sample platform 400, the Si wafer 702 has two thinned down parts 703A and 703B (for example, 30 to 100 µm) that extend toward each other as shown in FIG. 7B, and these two parts not only define the edges of the window 704, but also partially support the dielectric layer 714 and the first and second electrodes 710 and 712. In one embodiment, the thinned down parts 703A and 703B have substantially parallel surfaces. Note that for forming the front part of the window 704 DRIE processing is used, as discussed above with regard to FIG. 6. For the back part of the window 704, which is larger than the front part, the same DRIE technology may be used, where steps 612 to 618 are applied to the back side of the Si wafer.

Figure 8B:
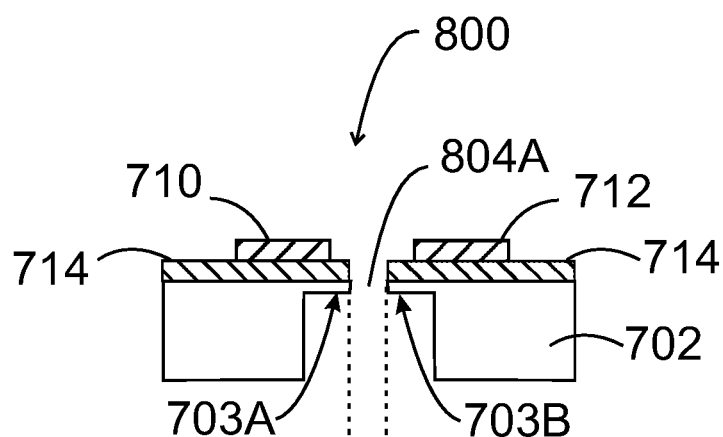
FIGS. 8A and 8B illustrate a membraneless sample platform having thinned down portions that define circular windows.
Figure 8A:
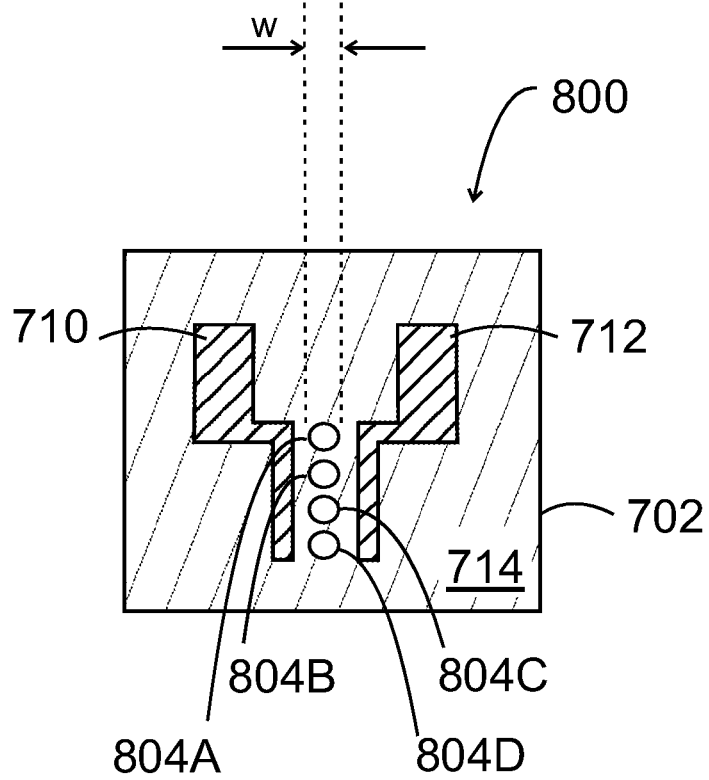

The membraneless sample platform 800 shown in FIGS. 8A and 8B is similar to the membraneless sample platform 700 except that instead of having a single window 704 with a rectangular shape, plural windows 804A to 804D (only four are shown in the figure but those skilled in the art would understand that more or less windows can be formed) are present. In addition, these plural windows are shaped in a circular fashion as illustrated in FIG. 8A. Note that these windows can be shaped to be oval, rectangular, square, etc. In one application, it is possible that a first subset of the windows is shaped in one way and a second subset of the windows is shaped in a different way. To obtain differently shaped windows 804, step 614 patterns the mask and photoresist accordingly. A width of the windows, or more accurately, a diameter of the windows for the embodiment of FIGS. 8A and 8B is equal to or smaller than 10 microns. In one application, the different windows may have different radii.

Figure 9B:
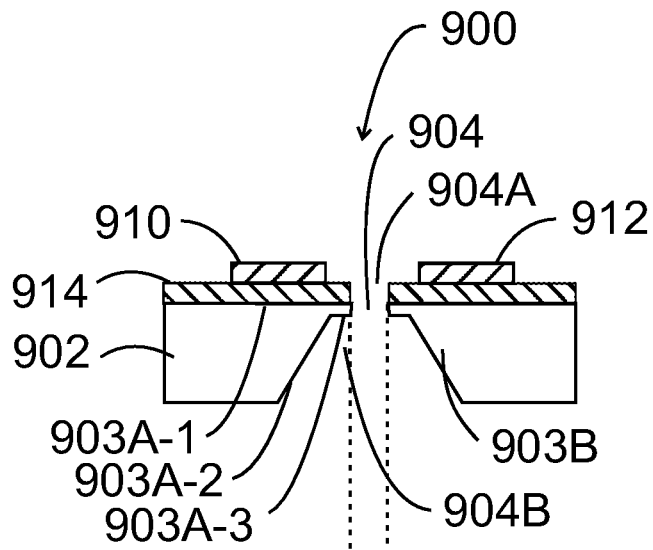
FIGS. 9A and 9B illustrate a membraneless sample platform having inclined thinned down portions that define a window.
Figure 9A:
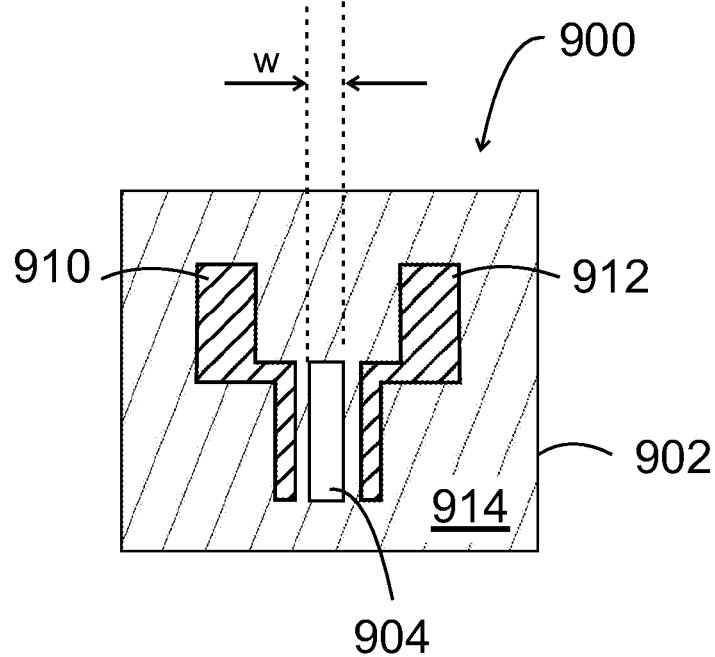

Another membraneless sample platform is shown in FIGS. 9A and 9B. FIG. 9A shows a membraneless sample platform 900 also having thinned down parts 903A and 903B, but these parts are not having faces substantially parallel as the membraneless sample platforms 700 or 800. In this embodiment, because the back part 904B of the window 904 is wet-etched (e.g., using KOH—potassium hydroxide—etching and not DRIE etching as for the front part 904A), the thinned down parts 903A and 903B have a top surface 903A-1 that is the surface of the Si wafer and a bottom surface 903A-2 that makes a non-zero angle with the top surface 903A-1, i.e., the bottom surface is inclined relative to the top surface. In one application, as illustrated in FIG. 9B, the bottom surface 903A-2 continues with another bottom surface 903A-3, which is parallel to the top surface 903A-1. Electrodes 910 and 912 and dielectric layer 914 may be formed similar to the embodiment illustrated in FIG. 4A.

Figure 10B:
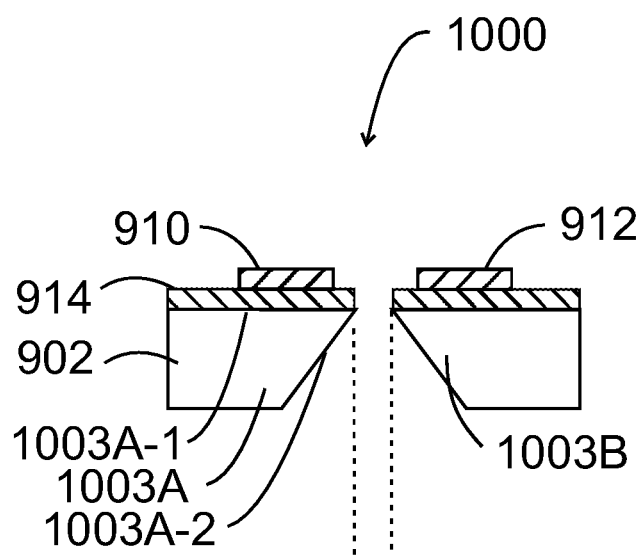
FIGS. 10A and 10B illustrate a membraneless sample platform having inclined thinned down portions that define a window.
Figure 10A:
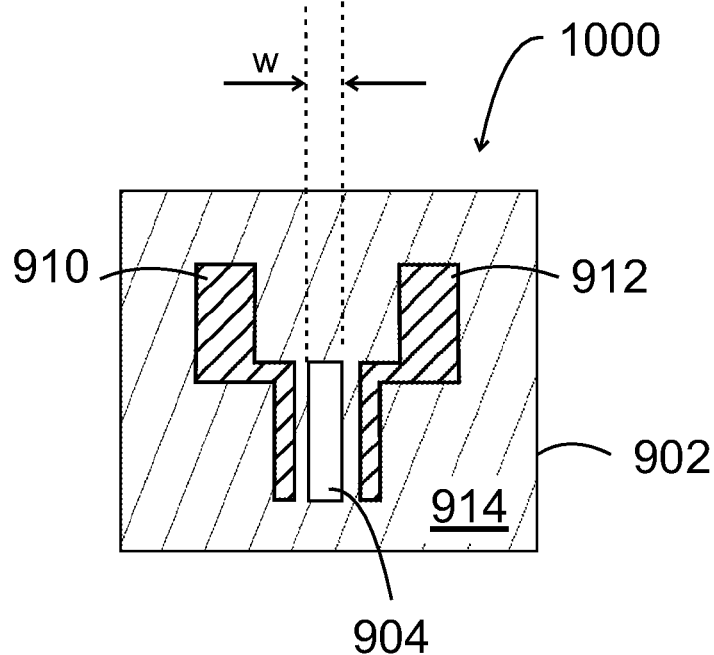

FIGS. 10A and 10B show another embodiment in which a membraneless sample platform 1000 has no thinned down portions, but instead has inclined walls 1003A and 1003B manufactured with wet-etching (e.g., KOH etching) so that the top surface 1003A-1 directly intersects with the bottom surface 1003A-2, which is different from the membraneless sample platform 900 shown in FIGS. 9A and 9B. While the last embodiments showed the windows 704 and 904 being very narrow (less than 10 microns), those skilled in the art would understand that the window can be larger, e.g., less than 20 microns or less than 100 microns.

Figure 11:
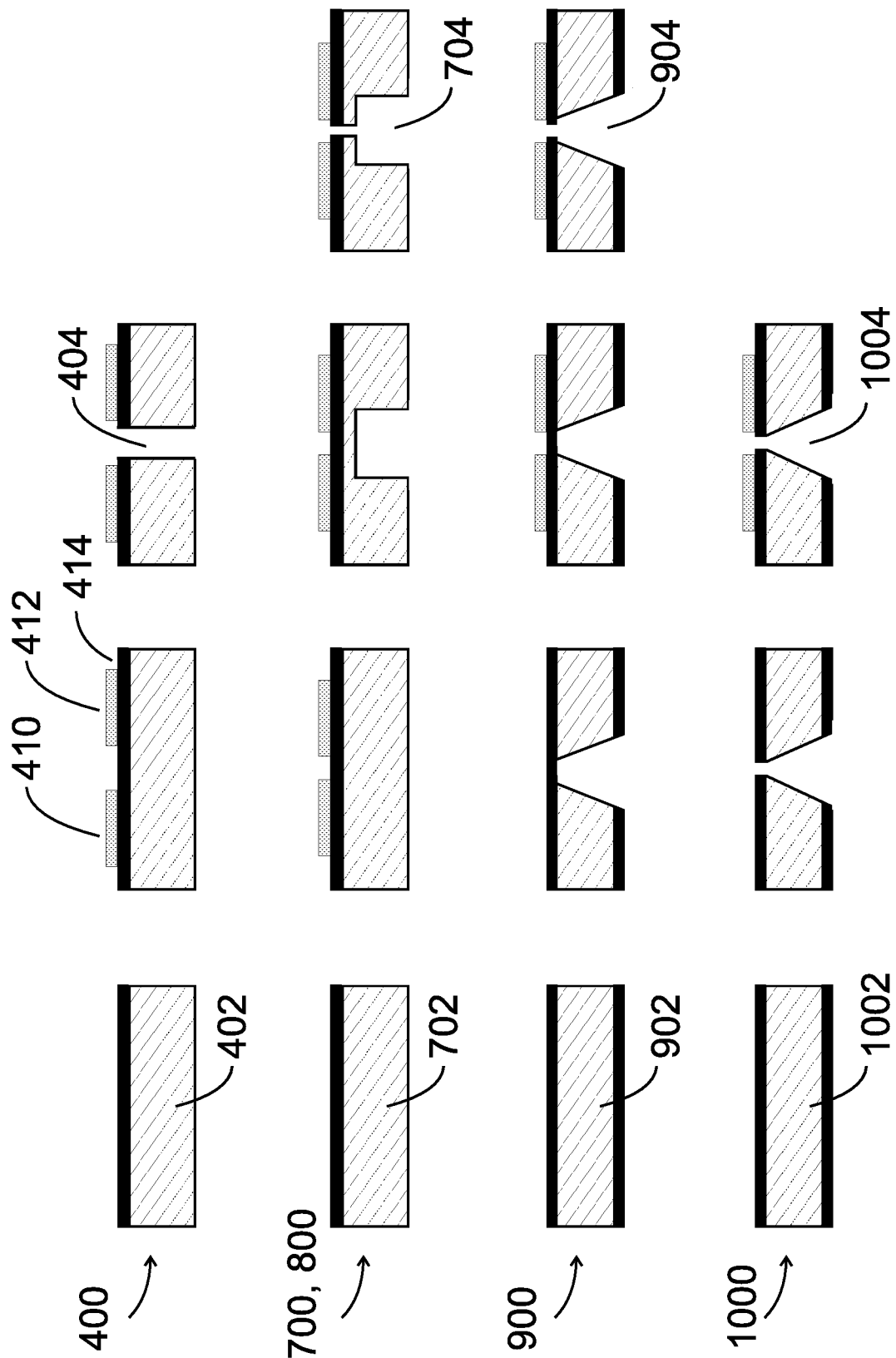
FIG. 11 illustrates various steps for forming different membraneless sample platforms.
Figure 12:
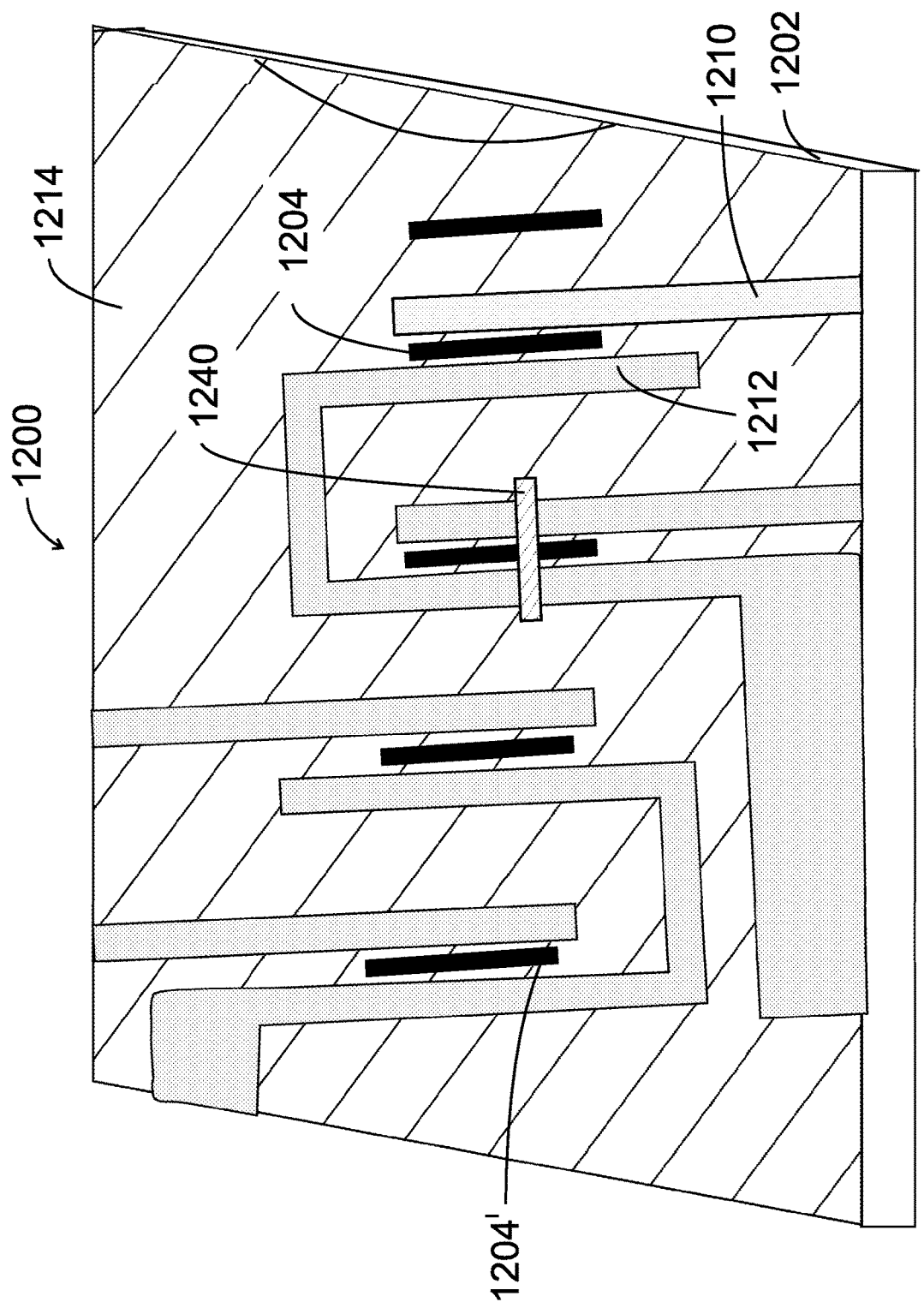
FIG. 12 illustrates a membraneless sample platform having plural windows.

FIG. 11 schematically shows the steps for manufacturing each of the various membraneless sample platforms discussed above. These steps should be considered together with the method steps illustrated in FIGS. 5A to 6. An overall membraneless sample platform that is obtained with one of the methods discussed above is illustrated in FIG. 12. Visible in the figure are plural windows 1204 that are sandwiched between corresponding electrodes 1210 and 1212. A target material 1240 (a nanofiber, in this case) is shown straddling the window. The electrodes are formed on a dielectric layer 1214 which may be formed directly on top of a Si wafer 1202. It is noted that plural windows and plural electrodes may be formed on a single substrate. It is also noted that the windows do not have to have the same shape and/or size. For example, FIG. 12 shows that window 1204 is narrower than window 1204'. Also, this figure shows that the plural windows are distributed parallel to each other on the substrate. One skilled in the art would understand that other arrangements are possible. In one embodiment, the thickness of the dielectric layer (which may be silicon oxide or silicon nitride) is between 30 and 500 nm, the thickness of the Si wafer may be about 150 to 300 µm, a size of the sample platform may be about 4×4 to 4×6 mm$^2$, a size of the sample platform window may be between 2 and 100 µm, and a thickness of the electrodes may be about 100 nm. Those skilled in the art would understand that these numbers are exemplary and other sizes and thickness may be implemented depending on the application.

The membraneless sample platforms have been discussed in the context of a TEM system. However, the same membraneless sample platforms may be used in other applications such as in a Raman microscope, atomic force microscope, probe station. The advantage of doing, for instance, electrical probing outside the TEM is that the target material can be electrically biased without the concern that the membrane will break or charging from the imaging beam will interfere with the electrical measurements. Furthermore, the sample platforms can be used for thermal and chemical processing. Because of the lack of the membrane added to a judicious selection of materials that make the sample platform, correlated measurements and additional reaction steps may be performed on the target particle or material while this sits directly on the membraneless sample platform. The sample platform will resist strong acids, high temperatures and other harsh environments, meaning only the target material will be modified and the sample platform function will not be compromised. Target materials with different thicknesses and shapes may be analyzed. The target material may be prepared in various ways to be attached to the platform: solution drop-casting, solution spin coating, FIB (focused ion beam) lamella preparation, with a nanomanipulator, and by mechanical exfoliation. The latter, in particular, was not previously possible.

Figure 14A:
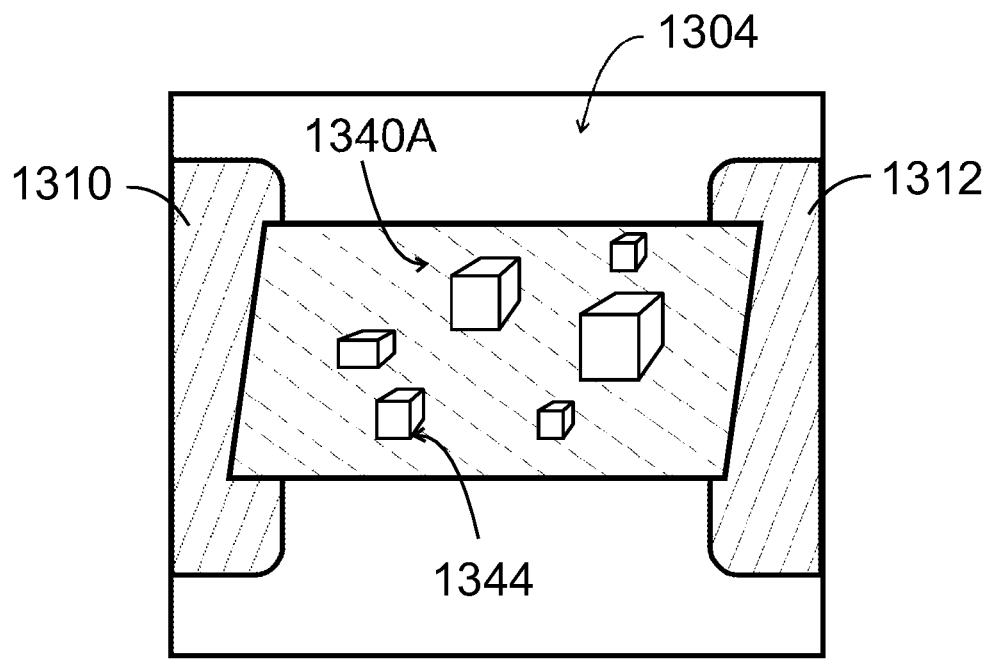
FIGS. 14A and 14B illustrate how electrical properties of a target material can be changed while on a membraneless sample platform.
Figure 14B:
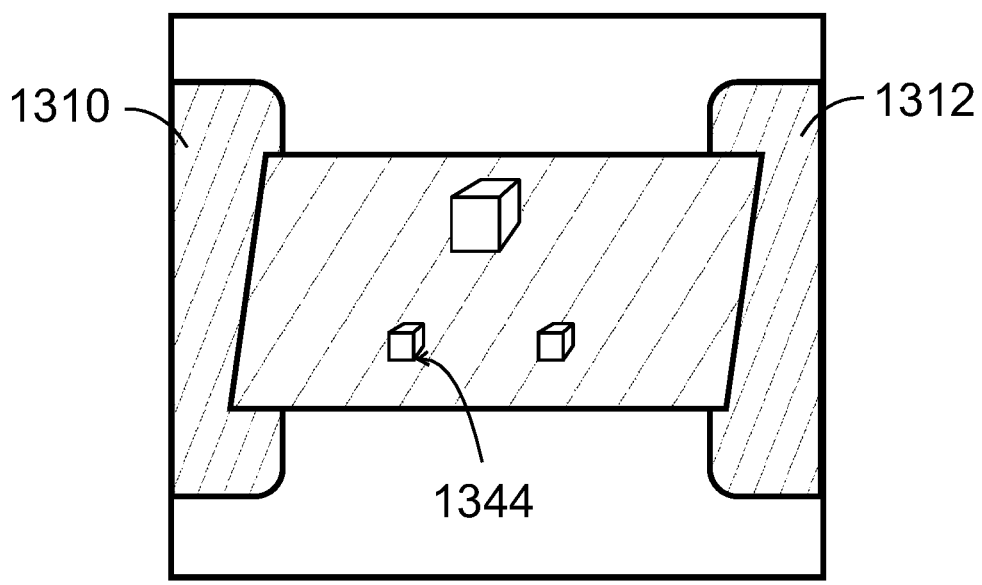

For example, graphite is primarily used as an electrode material in batteries and supercapacitors. However, the graphite has a layered structure or staked structure with inter lamellar spacing of 0.34 nm. In batteries, ions (lithium ions or others) are inserted between the graphite planes, so that they can be removed or re-inserted by applying an electrical field. This type of samples is sensitive to water and other solvents or any source of heat and chemicals. To prepare a TEM sample for such a material, without affecting the intercalated graphite, it requires a dry transfer method, such as mechanical exfoliation, which avoids the use of solvents or liquid media. However, such a method applies a pressure to the sample, which would be transmitted to the membrane in the membrane-based platform. In the past, the mechanical exfoliation method was not possible to be used because the pressure noted above would break the membrane. However, with a membraneless platform there is no problem to use the mechanical exfoliation method. This process is illustrated in FIGS. 13A to 13D. In FIG. 13A, there is a graphite material 1340 (for example, the kind used in batteries) that needs to be analyzed. A tape 1342 is applied in FIG. 13B to the graphite material 1340 to lift a portion 1340A of it, which will constitute the target material to be analyzed. After attaching part of the graphite material 1340 to the tape 1342, this assembly is pressed in FIG. 13C on a membraneless sample platform 1300 (i.e., the novel platforms discussed above). As previously discussed, pressing the tape 1342 onto the chip 1300 raises no issues because of the lack of the membrane. In FIG. 13D, the tape 1342 is removed and part of the target material 1340A remains on the sample platform 1300. FIG. 14A shows the target material 1340A being located between electrodes 1310 and 1312, over window 1304, and a number ions or molecules 1344 that are identified with the TEM device. After a voltage is applied between electrodes 1310 and 1312, the number of ions or molecules 1344 is reduced, as illustrated in FIG. 14B. Those skilled in the art would note the advantages of the membraneless platform used in the schematic TEM images of FIGS. 14A and 14B as the movement and migration of the ions or molecules due to joule heating and electromigration are not biased by a membrane. More advantages of the membraneless platform discussed herein are illustrated in FIG. 15. Those skilled in the art will recognize that the advantages of a membraneless platform are not limited to the listed ones.

Figure 16:
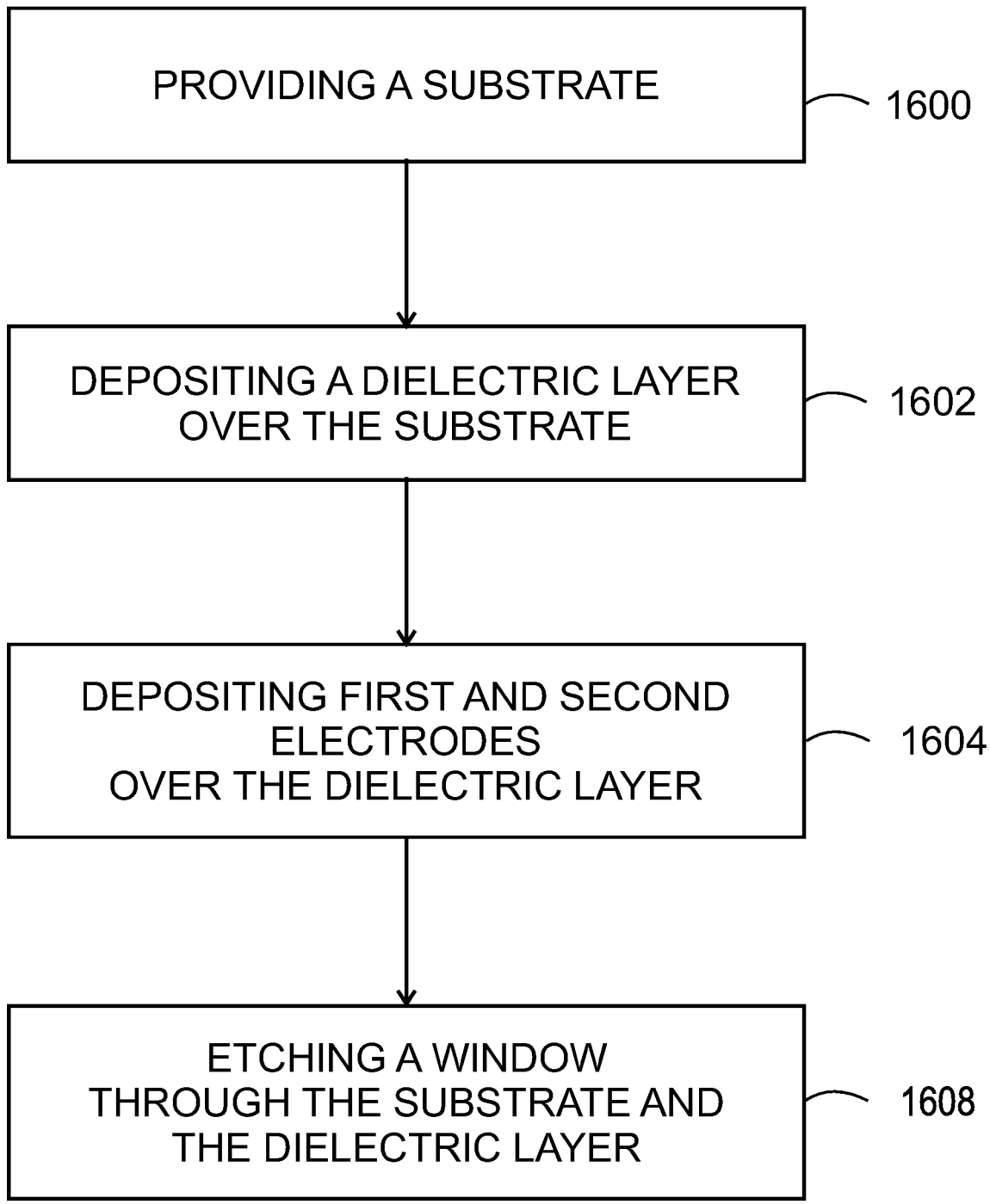
FIG. 16 is a flowchart of a method for forming a membraneless sample platform.

According to an embodiment illustrated in FIG. 16, there is a method for manufacturing a membraneless sample platform that includes a step 1600 of providing a substrate 402, a step 1602 of depositing a dielectric layer 414 over the substrate 402, a step 1606 of depositing first and second electrodes 410, 412 over the dielectric layer 414, and a step 1608 of dry etching a window 404 through the substrate 402 and the dielectric layer 414, where there is no material covering the window 404. The method may include an additional step of using the etching for making the window. In one application, dry etching or wet etching is used for the entire window. However, in another application, it is possible to use dry etching for a first side of the window and using a wet etching for a second side of the window. The window may be square, rectangular, circular, elliptical, etc.

The disclosed embodiments provide methods and systems for studying a target material under various conditions. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A multipurpose membraneless sample platform for supporting a target material, the platform comprising:
   a substrate;
   a dielectric layer formed over a side of the substrate;
   first and second electrodes formed over the dielectric layer; and
   a window formed through the substrate and the dielectric layer,
   wherein there is no material covering the window.

2. The platform of claim 1, wherein a beam freely passes through the window, from a first side of the platform to a second side of the platform, the second side being opposite to the first side.

3. The platform of claim 1, wherein one of the first and second electrodes extend along a length of the window.

4. The platform of claim 1, wherein the substrate is a silicon wafer, and the dielectric material includes silicon oxide or silicon nitride.

5. The platform of claim 1, wherein a width of the window is smaller than 30 µm.

6. The platform of claim 1, wherein a width of the window is smaller than 10 µm.

7. The platform of claim 1, wherein the substrate has two thinned down parts facing each other and defining the window.

8. The platform of claim 7, wherein the thinned down parts have parallel top and bottom surfaces.

9. The platform of claim 7, wherein the window is circular.

10. The platform of claim 9, wherein the window includes plural windows that are circular or have any other shape.

11. The platform of claim 7, wherein the two thinned down parts each has a bottom surface that is inclined relative to a top surface.

12. The platform of claim 1, wherein the window includes plural windows that are rectangular or have any other shape.

13. An imaging device for analyzing a target material, the device comprising:
   a source of a beam of electromagnetic radiation;
   a membraneless sample platform that supports the target material; and
   a screen on which an image of the target material is displayed,
   wherein the membraneless sample platform includes,
   a substrate;
   a dielectric layer formed over a side of the substrate;
   first and second electrodes formed over the dielectric layer; and
   a window formed through the substrate and the dielectric layer,
   wherein the beam passes through the window without interacting with any material.

14. The device of claim 13, wherein the substrate is a silicon wafer, and the dielectric material includes silicon oxide or silicon nitride.

15. The device of claim 13, wherein a width of the window is smaller than 30 µm.

16. The device of claim 13, wherein a width of the window is smaller than 10 µm.

17. The device of claim 13, wherein the substrate has two thinned down parts facing each other and defining the window.

18. A method for manufacturing a membraneless sample platform, the method comprising:
   providing a substrate;
   depositing a dielectric layer over the substrate;
   depositing first and second electrodes over the dielectric layer; and
   etching a window through the substrate and the dielectric layer,
   wherein there is no material covering the window.

19. The method of claim 18, further comprising:
   using the dry etching for a first side of the window and using a wet etching for a second side of the window, or a combination of dry and wet etchings for any of the sides.

20. The method of claim 18, wherein the window is circular.

* * * * *